(12) United States Patent
Akima

(10) Patent No.: US 11,144,317 B2
(45) Date of Patent: Oct. 12, 2021

(54) AC PARALLELIZATION CIRCUIT, AC PARALLELIZATION METHOD, AND PARALLEL INFORMATION PROCESSING DEVICE

(71) Applicant: FUJITSU LIMITED, Kawasaki (JP)

(72) Inventor: Hisanao Akima, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/997,992

(22) Filed: Aug. 20, 2020

(65) Prior Publication Data

US 2021/0072988 A1 Mar. 11, 2021

(30) Foreign Application Priority Data

Sep. 5, 2019 (JP) .............................. JP2019-161972

(51) Int. Cl.
*G06F 9/30* (2018.01)
*G06F 9/38* (2018.01)
*H03K 19/20* (2006.01)

(52) U.S. Cl.
CPC ........ *G06F 9/3001* (2013.01); *G06F 9/30065* (2013.01); *G06F 9/3885* (2013.01); *H03K 19/20* (2013.01)

(58) Field of Classification Search
None
See application file for complete search history.

(56) References Cited

U.S. PATENT DOCUMENTS

| 6,748,518 | B1 * | 6/2004 | Guthrie | G06F 9/383 712/214 |
| 2008/0260078 | A1 * | 10/2008 | Bouvet | H04L 1/0618 375/346 |
| 2008/0320276 | A1 * | 12/2008 | Krottendorfer | G06F 15/8015 712/28 |
| 2009/0198963 | A1 * | 8/2009 | Arimilli | G06F 9/30087 712/205 |
| 2012/0179876 | A1 * | 7/2012 | Guthrie | G06F 12/0895 711/141 |
| 2012/0216012 | A1 * | 8/2012 | Vorbach | G06F 9/3012 712/11 |

(Continued)

FOREIGN PATENT DOCUMENTS

JP H05-127904 A 5/1993

OTHER PUBLICATIONS

Gao, L. et al., SEED: A statically Greedy and Dynmically Adaptive Approach to Speculative Loop Execution, 2013, IEEE, pp. 1004-1016. (Year: 2013).*

(Continued)

*Primary Examiner* — Eric Coleman
(74) *Attorney, Agent, or Firm* — Fujitsu Patent Center

(57) ABSTRACT

An AC parallelization circuit includes a transmitting circuit configured to transmit a stop signal to instruct a device for executing calculation in an iteration immediately preceding an iteration for which a concerned device is responsible to stop the calculation in loop-carried dependency calculation; and an estimating circuit configured to generate, as a result of executing the calculation in the preceding iteration, an estimated value to be provided to an arithmetic circuit when the transmitting circuit transmits the stop signal.

7 Claims, 3 Drawing Sheets

(56) References Cited

U.S. PATENT DOCUMENTS

| | | | | |
|---|---|---|---|---|
| 2013/0117541 A1* | 5/2013 | Choquette | ............ | G06F 9/3851 |
| | | | | 712/214 |
| 2014/0189296 A1* | 7/2014 | Ould-Ahmed-Vall | ....................... | |
| | | | | G06F 9/3887 |
| | | | | 712/22 |
| 2018/0293122 A1* | 10/2018 | Craske | ................. | G06F 11/073 |
| 2018/0300132 A1* | 10/2018 | Daloze | ................. | G06F 9/3009 |
| 2019/0354494 A1* | 11/2019 | Wilkinson | .......... | G06F 13/4282 |

OTHER PUBLICATIONS

O'Keefe, M.T.O. et al., Hardware Barrier Synchronization:: Static Barrier MIMD (SBM), 1990, Purdue Dept. Elec. and Computer Engr., 28 pages. (Year: 1990).*

Campanoni, Simone et al., "HELIX-RC: An Architecture-Compiler Co-Design for Automatic Parallelization of Irregular Programs", ACM SIGARCH Computer Architecture News, ACM Special Interest Group on Computer Architecture, 2 Penn Plaza, Suite 701 New York NY 10121-0701 USA, vol. 42, No. 3, Jun. 14, 2014, pp. 217-228, XP058059557.

Campanoni, Simone et al., "HELIX-UP: Relaxing Program Semantics to Unleash Parallelization", 2015 IEEE/ACM International Symposium on Code Generation and Optimization (CGO), IEEE, Feb. 7, 2015, pp. 235-245, XP032741969.

Extended European Search Report dated Feb. 17, 2021 for corresponding European Patent Application No. 20193087.2, 10 pages.

* cited by examiner

AC PARALLELIZATION CIRCUIT, AC PARALLELIZATION METHOD, AND PARALLEL INFORMATION PROCESSING DEVICE

CROSS-REFERENCE TO RELATED APPLICATION

This application is based upon and claims the benefit of priority of the prior Japanese Patent Application No. 2019-161972, filed on Sep. 5, 2019, the entire contents of which are incorporated herein by reference.

FIELD

The embodiment discussed herein is related to an AC parallelization circuit, an AC parallelization method, and a parallel information processing device.

BACKGROUND

One of factors that hinder program parallelization is loop-carried dependency. The loop-carried dependency is that calculation is executed in a new iteration, depending on a result of a previous iteration in loop execution. When there is the loop-carried dependency, parallelization in which iterations are executed in arbitrary order is not executed.

However, in the iterations, there are not only sections (sequential codes) that have loop-carried dependency and thus are to be sequentially executed, but also sections (parallel codes) that do not have loop-carried dependency and are able to be executed in parallel. Therefore, the loop execution may be parallelized while the order in which the sequential codes are executed is maintained.

For example, when threads are allocated to the iterations, and a program is parallelized by multi-threading, values of variables that have loop-carried dependency are to be synchronized with each other between a thread to execute a certain iteration and a thread to execute an iteration immediately succeeding the certain iteration. When a time period for the synchronization is equal to or longer than a time period for executing the sequential codes, or when the synchronization is to be executed between many threads, the time period for the synchronization is a bottleneck for the entire program.

Therefore, as a technique for reducing the time period for the synchronization, there is ring cache architecture. In the ring cache architecture, cores are installed in a ring form. Immediately after the execution of sequential codes is completed, a core responsible to execute a current iteration transmits a completion signal and data (execution result) to a core responsible to execute an iteration immediately succeeding the current iteration. The completion signal and the data are cached in a memory adjacent to the core before the completion signal and the data are determined to be used. It is, therefore, possible to reduce the time period for the synchronization, compared to the case where the completion signal is confirmed and the data is requested after the completion signal and the data are determined to be used.

As an existing technique related to the parallel execution of a loop, there is an information processing device that executes, in parallel, a loop in which the determination of a condition for terminating the loop depends on data being processed and in which an iteration that satisfies the condition for terminating the loop when the iteration is executed is unknown in advance. The information processing device gives a priority to an instruction processing device that is executing the earliest iteration and is among instruction processing devices that are executing the loop in parallel. Then, the information processing device limits, to the instruction processing device having the priority, a device for transferring data to a memory and interrupting processing executed by an instruction processing device other than an instruction processing device that has detected the condition for the termination at the time of the termination of the loop. In this case, even when any instruction processing device detects the condition for terminating the loop, overtaking does not occur in processing, and the information processing device executes the loop in parallel while guaranteeing the same operation as that in the case where codes are sequentially executed.

Japanese Laid-open Patent Publication No. 05-127904 is disclosed as related art.

SUMMARY

According to an aspect of the embodiments, an AC parallelization circuit includes a transmitting circuit configured to transmit a stop signal to instruct a device for executing calculation in an iteration immediately preceding an iteration for which a concerned device is responsible to stop the calculation in loop-carried dependency calculation, and an estimating circuit configures to generate, as a result of executing the calculation in the preceding iteration, an estimated value to be provided to an arithmetic circuit when the transmitting circuit transmits the stop signal.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, an embodiment of an AC parallelization circuit disclosed herein, an AC parallelization method disclosed herein, and a parallel information processing device disclosed herein is described in detail based on the accompanying drawings. The embodiment does not limit the techniques disclosed herein.

Embodiment

Figure 1:
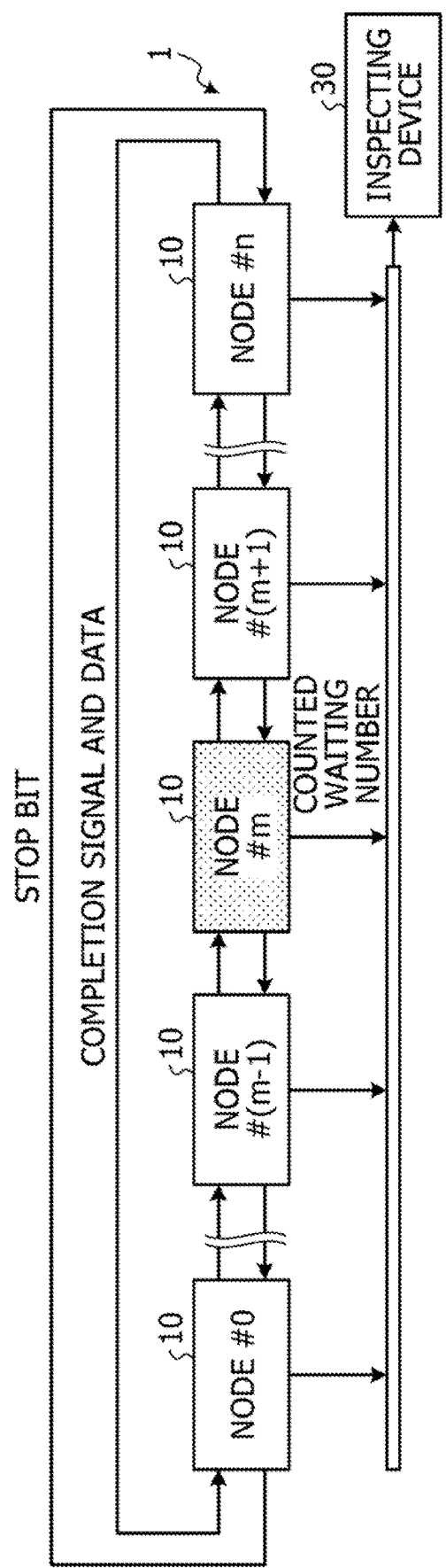
FIG. 1 is a diagram illustrating a configuration of a parallel processing system according to an embodiment.

First, a configuration of a parallel processing system according to the embodiment is described. FIG. 1 is a diagram illustrating the configuration of the parallel processing system according to the embodiment. As illustrated in FIG. 1, the parallel processing system 1 according to the embodiment includes a number (n+1) of nodes 10 indicated by nodes #0 to #n (n is a positive integer) and an inspecting device 30. The nodes #0 to #n are coupled to each other in a ring form. For example, the parallel processing system 1 is a ring cache architecture parallel processing system. In the parallel processing system 1, threads are allocated to iterations of a program having loop-carried dependency, and the program is executed in parallel by multi-threading.

The nodes 10 are information processing devices that execute the threads. For example, the node #0 executes a thread #0 of an iteration 1, a node #(m−1) executes a thread (m−1) of an iteration m, and a node #m executes a thread #m of an iteration (m+1). A node #(m+1) executes a thread #(m+1) of an iteration (m+2), . . . , and the node #n executes a thread #n of an iteration (n+1).

When each of the nodes 10 completely processes a thread, the node 10 sets 1 in a completion signal, sets a calculation result in data, and transmits the completion signal and the data to a subsequent node 10 of the concerned node 10. For example, when the node #(m−1) completely processes the thread #(m−1), the node #(m−1) sets 1 in a completion signal, sets a calculation result in data, and transmits the completion signal and the data to the node #m. When the node #m completely processes the thread #m, the node #m sets 1 in a completion signal, sets a calculation result in data, and transmits the completion signal and the data to the node #(m+1). When the node #n completely processes the thread #n, the node #n sets 1 in a completion signal, sets a calculation result in data, and transmits the completion signal and the data to the node #0.

When a second previous node 10 of each of the nodes 10 completely processes a thread, and a previous node 10 of each of the nodes 10 starts processing a thread, the concerned node 10 starts counting a dock. Then, when a number counted by the concerned node 10 is equal to a predetermined threshold, the concerned node 10 sets a stop (kill) bit to 1, transmits the stop bit to the previous node 10, and causes the previous node 10 to stop the thread. In the foregoing manner, the parallel processing system 1 executes AC parallelization.

For example, when a number counted by the node #m is equal to the predetermined threshold, the node #m sets a stop bit to 1 and transmits the stop bit to the node #(m−1). When a number counted by the node #(m+1) is equal to the predetermined threshold, the node #(m+1) sets a stop bit to 1 and transmits the stop bit to the node #m. When a number counted by the node #0 is equal to the predetermined threshold, the node #0 sets a stop bit to 1 and transmits the stop bit to the node #n.

As described above, when a second previous node 10 of each of the nodes 10 completely processes a thread, and a previous node 10 of each of the nodes 10 starts processing a thread, the concerned node 10 starts counting the dock. Then, when a number counted by the concerned node 10 is equal to the predetermined threshold, the concerned node 10 sets a stop bit to 1 and transmits the stop bit to the previous node 10.

Therefore, each of the nodes 10 may stop a thread of a previous node 10 of the node 10 at a high speed only by transmitting one-bit information to the previous node 10. For optimization problems that allow some errors and are an LSI placement and routing problem, a lithographic pattern generation problem, a vehicle routing problem, and the like, a processing speed may be improved by the AC parallelization.

The inspecting device 30 is coupled to each of the nodes 10. The inspecting device 30 acquires, from each of the nodes 10, counted waiting numbers when the nodes 10 completely process the threads, and displays the counted waiting numbers. Each of the counted waiting numbers is a number indicated by the dock when a concerned node 10 completely processes a thread from the time when a previous node 10 starts processing a thread.

The inspecting device 30 supports the verification of the effectiveness of the AC parallelization by comparing counted waiting numbers when the parallel processing system 1 executes the AC parallelization with counted waiting numbers when the parallel processing system 1 does not execute the AC parallelization and displaying the results of the comparison.

Figure 2:
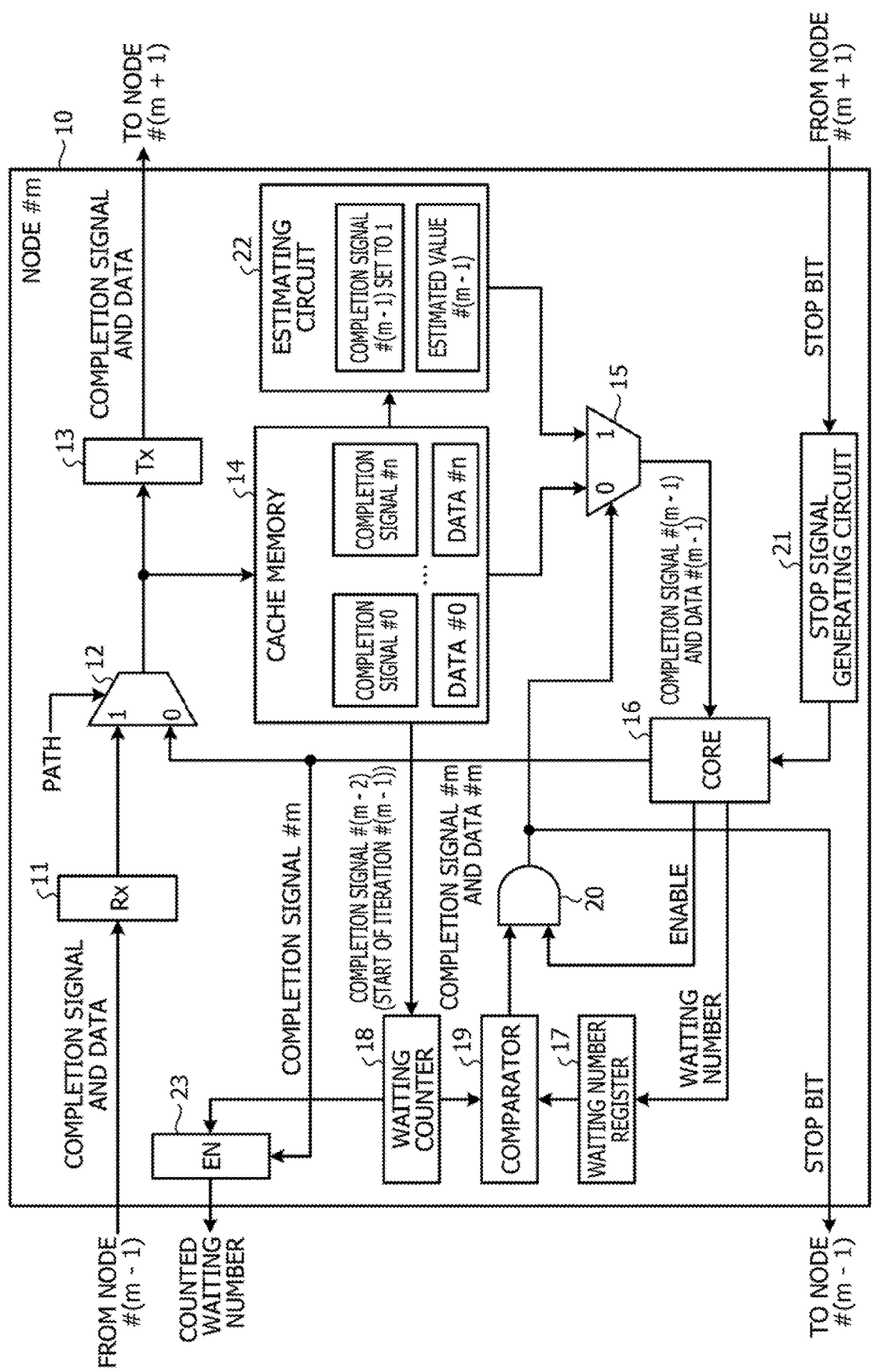
FIG. 2 is a diagram illustrating a configuration of a node.

Next, a configuration of each of the nodes 10 is described. FIG. 2 is a diagram illustrating the configuration of the node 10. Although FIG. 2 illustrates the configuration of the node #m, the other nodes 10 have the same configuration. As illustrated in FIG. 2, the node 10 includes a receiver (Rx) 11, a multiplexer 12, a transmitter (Tx) 13, a cache memory 14, a multiplexer 15, a core 16, a waiting number register 17, a waiting counter 18, a comparator 19, and an AND circuit 20. The node 10 also includes a stop signal generating circuit 21, an estimating circuit 22, and a latch 23.

The Rx 11 receives the completion signal and the data from the node #(m−1) and outputs the received completion signal and the received data to the multiplexer 12. The Rx 11 receives completion signals and data that exclude a completion signal #m and data #m. In this case, the completion signal #m is generated by the node #m and the data #m is generated by the node #m.

The multiplexer 12 selects, based on a path, either the completion signal received from the Rx 11 and the data received from the Rx 11 or the completion signal #m received from the core 16 and the data #m received from the core 16 and outputs the selected completion signal and the selected data to the Tx 13 and the cache memory 14. In this case, the path is a control signal to be used to select either the completion signal received from the Rx 11 and the data received from the Rx 11 or the completion signal #m received from the core 16 and the data #m received from the core 16. When the path indicates 1, the completion signal received from the Rx 11 and the data received from the Rx 11 are selected. When the path indicates 0, the completion signal #m received from the core 16 and the data #m received from the core 16 are selected.

The Tx 13 transmits the completion signal output by the multiplexer 12 and the data output by the multiplexer 12 to the node #(m+1).

The cache memory 14 stores the completion signal output by the multiplexer 12 and the data output by the multiplexer 12. For example, the cache memory 14 stores completion signals #0 to #n and data #0 to #n.

The multiplexer 15 selects, based on output of the AND circuit 20, either the completion signal #(m−1) stored in the cache memory 14 and the data #(m−1) stored in the cache memory 14 or a completion signal #(m−1) generated by the estimating circuit 22 and an estimated value #(m−1) generated by the estimating circuit 22 and outputs the selected completion signal and the selected data or value to the core 16.

When the core 16 detects that the completion signal #(m−1) stored in the cache memory 14 indicates 1, the core 16 uses the data #(m−1) to execute the thread #m. Then, when the core 16 completes the execution of the thread #m, the core 16 sets in the completion signal #m, sets a result of the execution in the data #m, outputs the completion signal #m and the data #m to the multiplexer 12, and outputs the completion signal #m to the latch 23.

In the case where the AC parallelization is executed, the core 16 sets an AC enable to 1 and outputs the AC enable to the AND circuit 20. The core 16 sets a waiting number in the waiting number register 17. In the AC parallelization, the waiting number is a number indicated by the dock when the node #m starts processing from the time when the node #(m−1) starts processing. When the stop signal generating circuit 21 outputs a stop signal, the core 16 stops executing the thread #m.

The waiting number register 17 stores the waiting number. When the completion signal #(m−2) is set to 1 and stored in the cache memory 14, the waiting counter 18 starts counting the dock. The comparator 19 compares a number counted by the waiting counter 18 with the waiting number stored in the waiting number register 17. When the number counted by the waiting counter 18 is equal to the waiting number, the comparator 19 outputs 1 to the AND circuit 20.

The AND circuit 20 obtains a logical product of the output of the comparator 19 and the AC enable, outputs a result indicating the logical product as a stop bit to the node #(m−1), and outputs, to the multiplexer 15, the stop bit as control input. When the output of the AND circuit 20 indicates 1, a predetermined time period has elapsed after the start of the processing by the node #(m−1), and the AC parallelization is to be executed. Therefore, the node #(m−1) stops the thread #(m−1) and the multiplexer 15 selects output of the estimating circuit 22.

When the stop signal generating circuit 21 receives the stop bit from the node #(m+1) and detects that the stop bit is 1, the stop signal generating circuit 21 generates the stop signal and outputs the stop signal to the core 16. The core 16 stops the thread #m upon detecting the stop signal.

The estimating circuit 22 sets the completion signal #(m−1) to 1 and sets an estimated value in the data #(m−1). The estimating circuit 22 uses 0 or a previous value as the estimated value, for example. Alternatively, the estimating circuit 22 may use, as the estimated value, the maximum value, the minimum value, an intermediate value, a moving average, or the like among past values. The past values are stored in the cache memory 14. Since the estimating circuit 22 sets the estimated value in the data #(m−1) in the foregoing manner, the parallel processing system 1 may estimate the data #(m−1) at a high speed.

The latch 23 treats the completion signal #m as an enable signal and holds a value of the waiting counter 18. The counted waiting number held in the latch 23 is read by the inspecting device 30.

Figure 3:
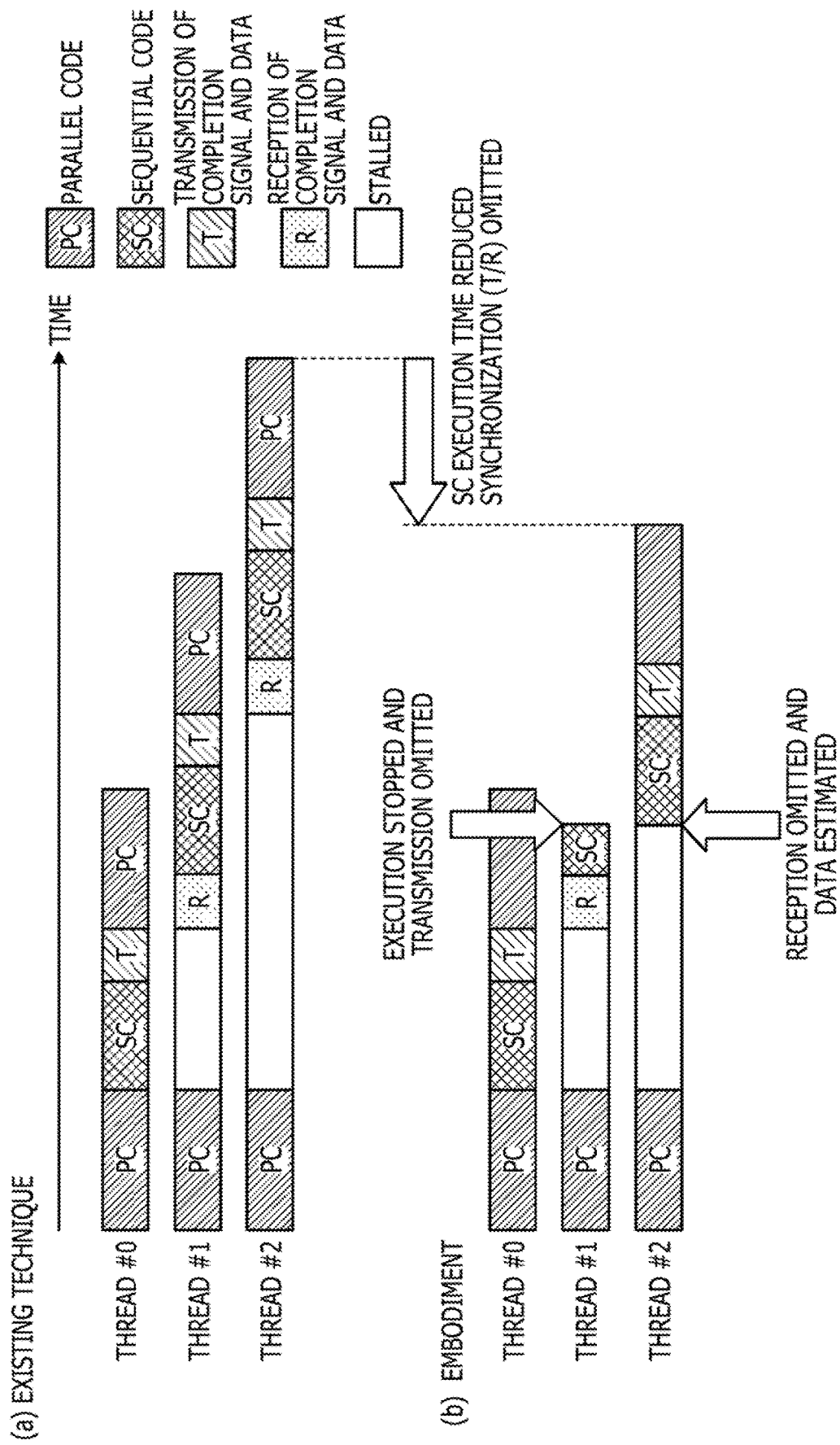
FIG. 3 illustrates diagrams describing an effect of the parallel processing system.

Next, an effect of the parallel processing system 1 is described. FIG. 3 illustrates diagrams describing the effect of the parallel processing system 1. FIG. 3 of (a) illustrates an example of execution times in an existing technique. FIG. 3 of (b) illustrates an example of execution times in the embodiment.

As illustrated in FIG. 3 of (a), in the existing technique, after a thread #0 executes a parallel code and a sequential code, the thread #0 transmits a completion signal and data to a thread #1, executes the parallel code, and terminates processing. When the thread #1 is stalled and receives the completion signal and the data from the thread #0 after executing the parallel code, the thread #1 executes a sequential code, transmits a completion signal and data to a thread #2, executes the parallel code, and terminates processing. When the thread #2 is stalled and receives the completion signal and the data from the thread #1 after executing the parallel code, the thread #2 executes a sequential code, transmits a completion signal and data to a thread #3, executes the parallel code, and terminates processing.

On the other hand, as illustrated in FIG. 3 of (b), in the embodiment, after a thread #0 executes a parallel code and a sequential code, the thread #0 transmits a completion signal and data to a thread #1, executes the parallel code, and terminates processing. When the thread #1 is stalled and receives the completion signal and the data from the thread #0 after executing the parallel code, the thread #1 executes a sequential code. When a predetermined time period elapses after the reception of the completion signal, the thread #1 is stopped by a thread #2. When the thread #2 is stalled after executing the parallel code, the thread #1 receives the completion signal, and a predetermined time period elapses, the thread #2 transmits a stop signal to the thread #1 and uses an estimated value to execute a sequential code. Then, the thread #2 transmits a completion signal and data to a thread #3, executes the parallel code, and terminates processing.

In FIG. 3 of (b), a time period for executing the sequential code by the thread #1 is reduced, and time periods for transmitting and receiving the completion signals and the data that are used to synchronize data between the threads #1 and #2 are omitted, compared to FIG. 3 of (a). Therefore, the parallel processing system 1 may reduce the execution times.

As described above, in the embodiment, when the completion signal #(m−2) is set to 1 and stored in the cache memory 14, the waiting counter 18 of the node #m starts counting the dock. Then, the comparator 19 compares the number counted by the waiting counter 18 with the waiting number stored in the waiting number register 17. When the number counted by the waiting counter 18 is equal to the waiting number, the comparator 19 outputs 1 to the AND circuit 20. The AND circuit 20 calculates a logical product of the AC enable and the output of the comparator 19 and outputs the result of the calculation as the stop bit to the node #(m−1).

The estimating circuit 22 sets the completion signal #(m−1) to 1 and sets the estimated value in the data #(m−1). Then, the multiplexer 15 selects, based on the output of the AND circuit 20, either the completion signal #(m−1) stored in the cache memory 14 and the data #(m−1) stored in the cache memory 14 or the completion signal #(m−1) generated by the estimating circuit 22 and the estimated value #(m−1) generated by the estimating circuit 22 and outputs the selected completion signal and the selected data or value to the core 16.

Therefore, the node #m determines whether the thread #(m−1) executed by the node #(m−1) is to be stopped. When the node #m determines that the thread #(m−1) is to be stopped, the node #m may instruct the node #(m−1) to stop the thread #(m−1) at a high speed and may estimate a calculation result of the node #(m−1) at a high speed.

In the embodiment, when the stop signal generating circuit 21 of the node #m receives the stop bit from the node #(m+1) and the stop bit is 1, the stop signal generating circuit 21 of the node #m generates a stop signal to stop the thread #m and outputs the stop signal to the core 16. Therefore, the node #m may quickly stop the thread #m based on an instruction from the node #(m+1).

In the embodiment, since the latch 23 of the node #m treats the completion signal #m as the enable signal and holds the value of the waiting counter 18, the node #m may provide data useful to verify the effectiveness of the AC parallelization.

Although the embodiment describes the case where the threads are executed, the nodes 10 may execute other units of processing. Although the embodiment describes the case where the cores 16 execute the threads, other arithmetic devices may execute the threads.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An AC parallelization circuit, comprising:
   a transmitting circuit configured to transmit a stop signal to instruct a device for executing calculation in an iteration immediately preceding an iteration for which a concerned device is responsible to stop the calculation in loop-carried dependency calculation; and
   an estimating circuit configured to generate, as a result of executing the calculation in the preceding iteration, an estimated value to be provided to an arithmetic circuit when the transmitting circuit transmits the stop signal.

2. The AC parallelization circuit according to claim 1, wherein the transmitting circuit includes:
   a counter circuit configured to start counting when the calculation is started in the preceding iteration, and
   a comparing circuit configured to compare a number counted by the counter circuit with a predetermined threshold and transmits the stop signal when the counted number is equal to the predetermined threshold.

3. The AC parallelization circuit according to claim 2, wherein
   the arithmetic circuit uses the estimated value provided by the estimating circuit to execute calculation in the iteration for which the concerned device is responsible based on the stop signal transmitted by the comparing circuit.

4. The AC parallelization circuit according to claim 3, wherein further comprising
   an instructing circuit configured to instruct the arithmetic circuit to stop the calculation upon receiving a stop signal from a device for executing calculation in an iteration immediately succeeding the iteration for which the concerned device is responsible.

5. The AC parallelization circuit according to claim 3, wherein further comprising
   a storage circuit configured to store the counted number when the calculation in the iteration for which the concerned device is responsible is completed by the arithmetic circuit.

6. An AC parallelization method executed by a computer, the AC parallelization method comprising:
   transmitting a stop signal to instruct a device for executing calculation in an iteration immediately preceding an iteration for which a concerned device is responsible to stop the calculation in loop-carried dependency calculation; and
   providing an estimated value generated as an estimated value of a result of executing the calculation in the preceding iteration to an arithmetic circuit when the stop signal is transmitted.

7. A parallel information processing device, comprising:
   an arithmetic unit configured to execute calculation in an iteration for which the parallel information processing device is responsible in loop-carried dependency calculation;
   a transmitter configured to transmit a stop signal to instruct a device for executing calculation in an iteration immediately preceding the iteration for which the parallel information processing device is responsible to stop the calculation in the loop-carried dependency calculation; and
   an estimator configured to generate, as a result of executing the calculation in the preceding iteration, an estimated value to be provided to the arithmetic unit when the transmitter transmits the stop signal.

* * * * *